(12) United States Patent
Williams et al.

(10) Patent No.: US 6,655,534 B2
(45) Date of Patent: Dec. 2, 2003

(54) CONFIGURABLE RACK RAIL SYSTEM FOR DUAL MOUNT CONFIGURATIONS

(75) Inventors: Tiffany J. Williams, Austin, TX (US); Clarence L. Langlinais, Jr., Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/055,156

(22) Filed: Jan. 23, 2002

(65) Prior Publication Data

US 2003/0136749 A1 Jul. 24, 2003

(51) Int. Cl.[7] .................................................. A47F 7/00
(52) U.S. Cl. ...................... 211/26; 211/190; 312/334.4; 312/223.1; 361/829
(58) Field of Search .......................... 211/26, 26.2, 189, 211/190, 192, 194, 162, 175; 361/683, 825, 724, 725, 727; 248/242, 243, 220.43, 220.21; 312/223.1–223.3, 257.1, 265.1, 334.1, 334.8, 348.1, 265.2, 265.5–265.6

(56) References Cited

U.S. PATENT DOCUMENTS

| | | | | |
|---|---|---|---|---|
| 3,133,768 A | * | 5/1964 | Klakovich | 384/17 |
| 5,571,256 A | * | 11/1996 | Good et al. | 211/26 |
| 5,802,990 A | | 9/1998 | Lin | 108/157.1 |
| 5,819,956 A | | 10/1998 | Rinderer | 211/26 |
| 5,927,514 A | | 7/1999 | Linder | 211/26 |
| 5,934,485 A | | 8/1999 | Harris et al. | 211/26 |
| 6,070,957 A | * | 6/2000 | Zachrai | 312/334.4 |
| 6,181,549 B1 | | 1/2001 | Mills et al. | 361/683 |
| 6,223,908 B1 | | 5/2001 | Kurtsman | 211/26 |
| 6,230,903 B1 | * | 5/2001 | Abbott | 211/26 |
| 6,305,556 B1 | * | 10/2001 | Mayer | 211/26 |
| 6,422,399 B1 | * | 7/2002 | Castillo et al. | 211/26 |
| 2001/0040142 A1 | * | 11/2001 | Haney | 211/183 |
| 2001/0040203 A1 | * | 11/2001 | Brock et al. | 248/222.11 |
| 2002/0158556 A1 | * | 10/2002 | Cheng | 313/34.8 |

OTHER PUBLICATIONS

Castillo, et al., pending U.S. patent application Ser. No. 09/718,201, "Rack System and Method Having Tool–less Releasable Arm Assembly," filed Nov. 21, 2000.

* cited by examiner

Primary Examiner—Bruce A. Lev
Assistant Examiner—Jennifer E. Novosad
(74) Attorney, Agent, or Firm—Baker Botts L.L.P.

(57) ABSTRACT

A rail system for an equipment rack includes a removable bracket on each rail of the system which can be exchanged between the rails to enable the rail system to be coupled between the posts of an equipment rack in multiple configurations. Each rail additionally includes a front bracket, a fixed center bracket, and a rear bracket. In one mounting configuration, the front bracket and the removable center bracket are coupled to a post of the equipment rack. In a second configuration, the removable center brackets of the rails are exchanged with one another so that the rail system can be mounted in a center mount configuration in which the removable center bracket and the fixed center bracket are mounted on opposite sides of the post. The rail system includes a rear bracket with cable management features.

20 Claims, 3 Drawing Sheets

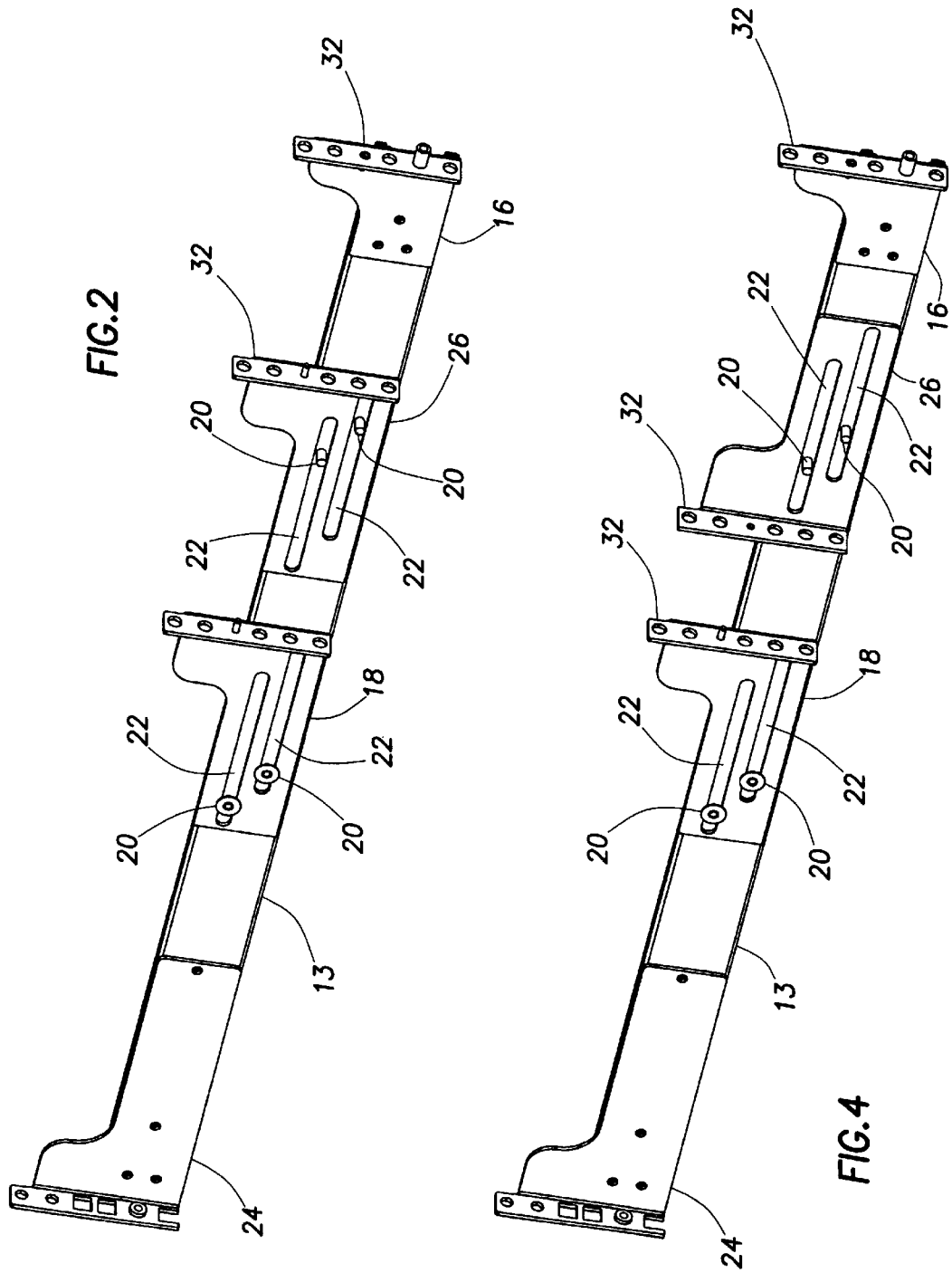

CONFIGURABLE RACK RAIL SYSTEM FOR DUAL MOUNT CONFIGURATIONS

TECHNICAL FIELD

The present disclosure relates generally to the field of housing units for computer systems and, more particularly, to a system and method for mounting a computer system in a rack environment.

BACKGROUND

In environments in which the housings of electronic equipment, including computer systems, switches, routers, hubs, and other information handling systems, must be mounted in a limited space, the equipment and computer systems are often stored vertically in metal racks, sometimes referred to as equipment racks. Within the equipment rack, each unit of equipment is mounted to brackets that are coupled to the posts of the rack. The racks may have two posts or four posts. Two-post racks, sometimes referred to as relay racks or telecom racks, are common in the telecommunications industry. In the telecommunications industry, racks are used to house switches, routers, hubs, and other telecommunications equipment. As compared to four post racks, two post racks are sometimes preferred because two post racks generally occupy less floor space. Four post racks are sometimes preferred for the housing of computer systems because four post racks are generally more stable and include cable management fixtures in the rear of the racks. As compared to two post racks, four post racks provide an extra level of access security.

Some users of computer systems have recently attempted to use two post racks for housing computer servers and other computer systems. Earlier designs of server rack mounting hardware for two post racks included a fixed shelf for supporting the mounted unit. Because a fixed shelf design does not allow the mounted unit to be slid in and out of position, the fixed shelf design reduced the serviceability of the rack mounted electronic units. To upgrade or service a unit mounted on a fixed shelf, the unit often must be removed from the rack, causing the customer to experience excessive downtime of the electronic unit. Moreover, prior designs of mounting hardware for two post racks did not include a cable management fixture for supporting the cables that were coupled to the rear of the mounted unit. In addition, because of perceived or real deficiencies in the structure integrity of two post racks, the use of two post racks has been disfavored in the computer industry, despite the general acceptance and use of two-post racks in the telecommunications industry.

SUMMARY

In accordance with the present disclosure, a rail system for an equipment rack includes a front bracket, a fixed center bracket, and a rear bracket. Each rail of the rail system also includes a removable center bracket. The removable center bracket operates to couple the rail system to the posts of the equipment rack. In a flush mount position, the front bracket and the removable center bracket are mounted on opposite sides of each post. For a center mount position, the removable center brackets of the rail system are exchanged between the left and right rails of the computer system, and rotated 180 degrees so that the plates of the removable center brackets are oriented toward the posts. The removable center bracket and the fixed center bracket are mounted on opposite sides of each post of the equipment rack.

An advantage of the rail system disclosed herein is a rail system that has the structural stability to support a computer system of other equipment in a two post rack. Whether the rail system is mounted in a flush mount configuration or a center mount configuration, the rail system is mounted to the posts of the rack such that brackets are mounted on opposite faces of the posts of the rack, providing the necessary structural stability to the rail system and posts of the equipment rack.

Another advantage of the rail system disclosed herein is a rail system design that is flexible and permits the conversion of the rail system from a flush mount configuration to a center mount configuration without the need for additional equipment. Removable center brackets are exchanged between the rails of the rail system as the rail system is switched between a flush mount configuration and a center mount configuration.

Another advantage of the rail system is a rail system for a two post equipment rack that includes a provision for cable management. The rear bracket of the rail system disclosed herein includes a fixture for managing the cables of the computer system of the equipment rack. Another advantage of the rail system disclosed herein is a rail system that permits the servicing of the computer system of the rack through a sliding mechanism. Another advantage of the rail system disclosed herein is a rail system that can accommodate computer systems of varying heights without affecting the structural stability of the equipment rack. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 a pictorial view of a removable slider bracket in a flush mount configuration;

FIG. 4 is a pictorial view of a removable slider bracket in a center mount configuration.

DETAILED DESCRIPTION

The rack rail system disclosed herein provides a convenient mechanism for supporting both flush mount and center-mounted computer systems in a two-post rack. The rack rail system includes a removable bracket that shifts between the left and right rails of the system depending on whether the computer system is mounted in a flush mount position or a center mount position.

Figure 1:
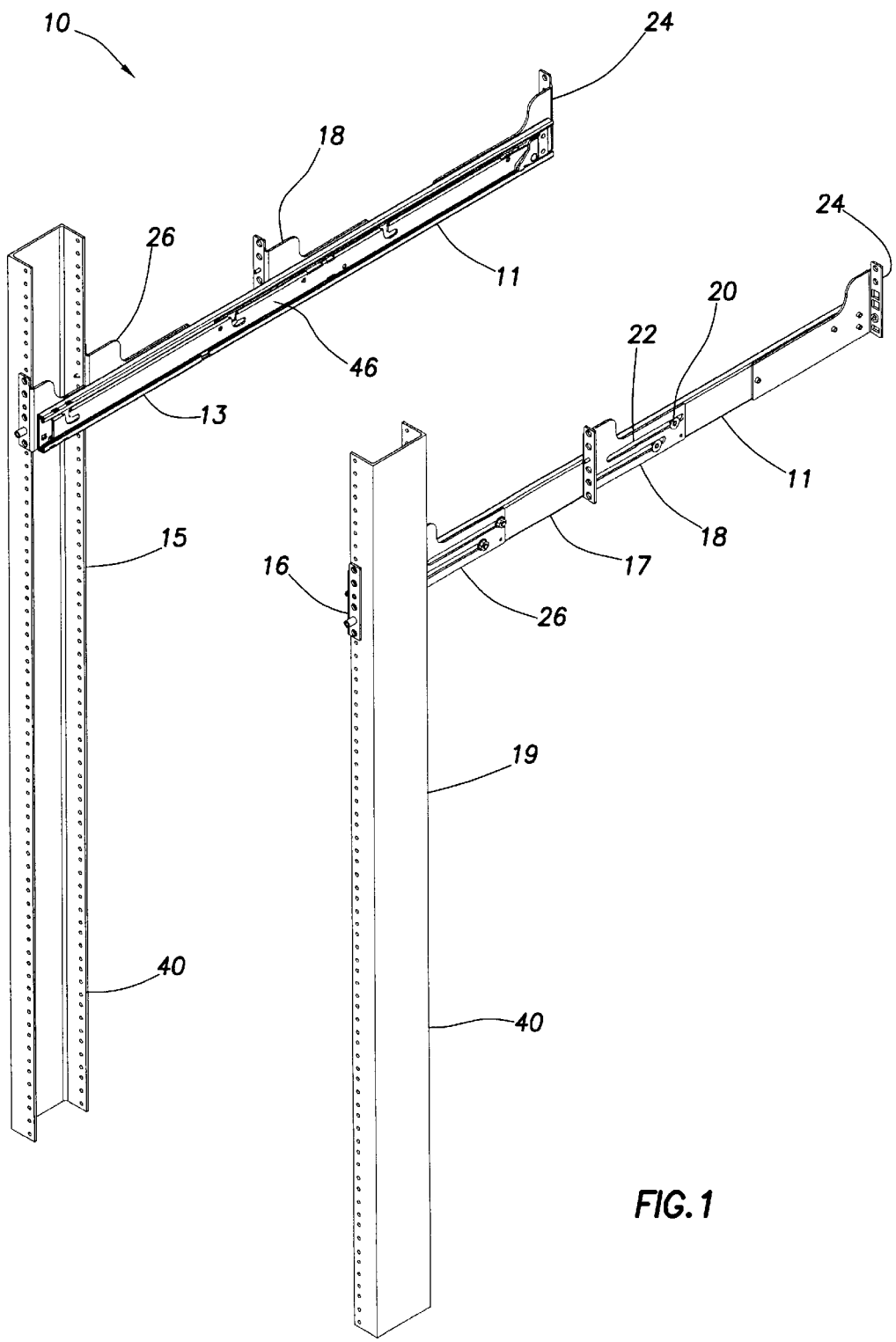
FIG. 1 is a front view of a rail rack system in a flush mount configuration.

Shown in FIG. 1 is a front view of rail rack system 10 mounted on a pair of posts 40 in a flush mount configuration. The flush mount configuration involves the mounting of the rack rail system such that the computer unit is flush with the front surface of the posts of the rack. Rail system 10 includes a pair of rails 11. The pair of rails 11 includes a left rail 13, which is mounted to a left post 15, and a right rail 17, which is mounted to a right post 19. The rails are denominated as a left rail or a right rail from the point of view of the front of the rack. Each rail 11 includes a front bracket 16 and a fixed center bracket 18. Each fixed center bracket 18 includes screws 20 that couple the fixed center bracket at channels 22 along the side of the bracket. Each fixed center bracket 18 has a limited range of lateral motion along the length of each rail as a result of movement about the screws 20 and channels 22. Each rail 11 includes a rear bracket 24, which includes apertures or an additional cable management fixture for supporting or managing cables coupled to the unit. Each rail 11 includes a slide mechanism for supporting the movement of the unit along the rails. The slide mechanism 46 of left rail 13 is visible in the interior of left rail 13.

Each rail 11 includes a removable slider bracket 26. Like fixed center brackets 18, each of the removable slider bracket 26 is coupled to a rail 11 by screws 20 inserted through a pair of channels 22. Like the fixed center brackets 18, each removable slider bracket 26 includes a plate 32, which is oriented perpendicularly to the plane of the channels 22. In a flush mount configuration, each front bracket 16 is mounted to a respective post 40 on the front face of each post 40, and a removable slider bracket 26 is mounted to a respective post 40 on the rear face of each post 40. The placement of a front bracket and a removable slider bracket on opposite sides of each post in a flush mount configuration provides for a structurally stable rack rail system, while allowing for the longitudinal movement of a computer system according to the slide mechanism along the rails of the rack rail system. A larger view of left rail 13 is shown in FIG. 2. Left rail 13 includes a front bracket 16, a rear bracket 24, and a fixed center bracket 18. Also shown in FIG. 2 is removable slider bracket 26. Left rail 13 is coupled to the post by sandwiching the post between the plates 32 of front bracket 16 and removable slider bracket 26.

Figure 3A:
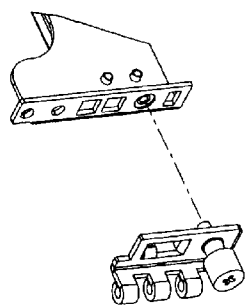
FIG. 3A is a pictorial view of cable management fixture.
Figure 3:
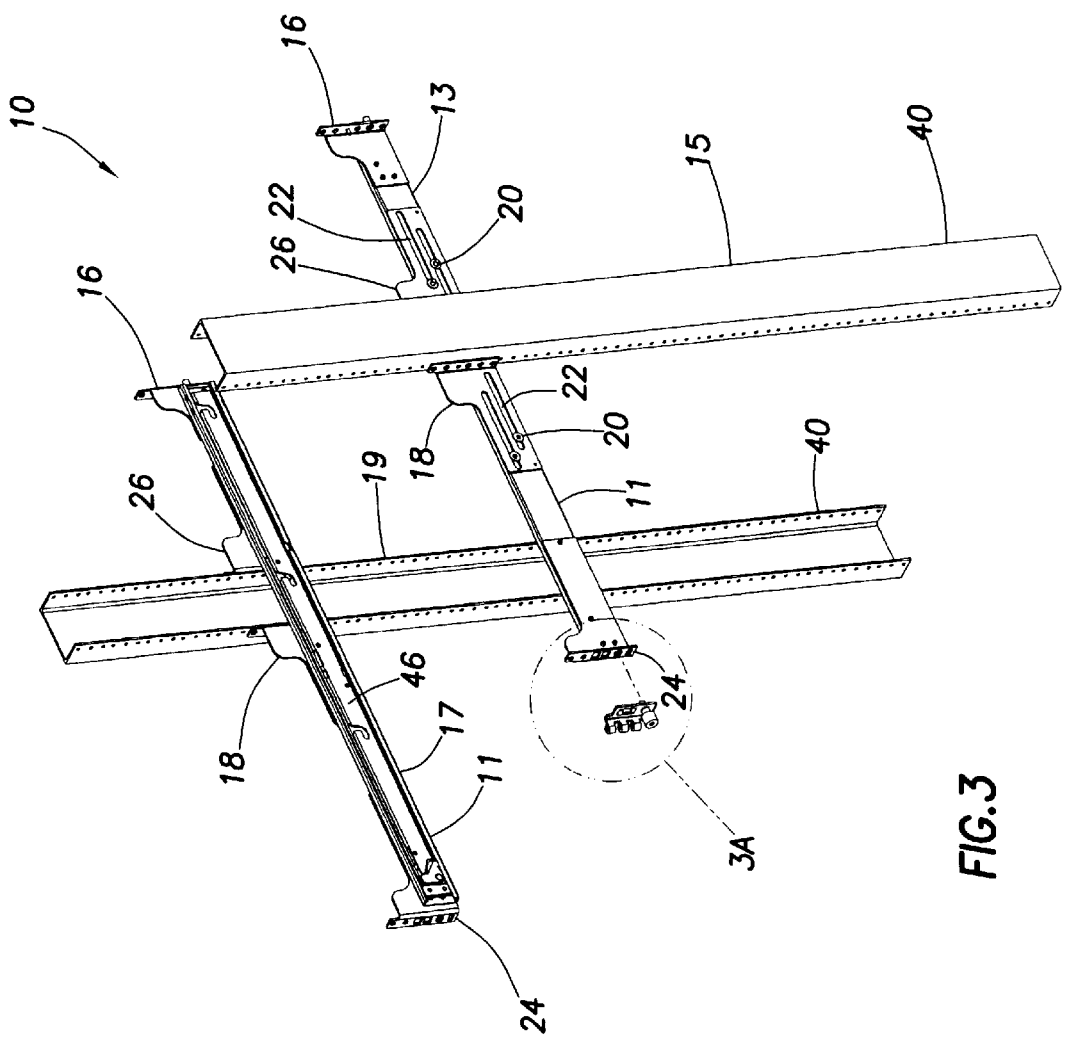
FIG. 3 is a rear view of a rack rail system in a center mount configuration.

Shown in FIG. 3 is a rear view a rack rail system 10 that is mounted on a pair of posts 40 in a center mount configuration. The center mount configuration involves the mounting of the rack rail system on the posts of the rack such that the center of the computer system is proximate the posts of the rack. A left rail 13 is mounted to a left post 15, and a right rail 17 is mounted to a right post 19. The slide mechanism 46 in right rail 17 is visible in the interior of right rail 17. Each rail 11 terminates in a front bracket 16, which is located at the front of the rack and in front of posts 40, and a rear bracket 24, which is located at rear of the rack and behind posts 40. For each rail 11, a removable slider bracket 26 is coupled at the front face of the rail such that the plate of each removable slider bracket is against the front face of a respective rail. For each rail 11, a fixed center bracket 18 is coupled to the rear face of the rail. Like the mounting arrangement for a flush mounted rail system, the mounting arrangement for a center mount rail system involves the placement of two brackets on opposite sides of each post. In the case of a center mount rail system, the mounting brackets that are coupled to each post are the removable slider bracket 26 and a center bracket 18. As was the case with the flush mount arrangement, the placement of brackets on opposite sides of each post in a center mount arrangement provides structural stability of the rack, while allowing for the longitudinal sliding of a computer system along the rails of the rack rail system. A larger view of left rail 13 apart from a post and in a center mount configuration is shown in FIG. 4. Left rail 13 includes a front bracket 16, a rear bracket 24, and a fixed center bracket 18. Also shown in FIG. 4 is removable slider bracket 26. Left rail 13 is coupled to the post between the plates 32 of fixed center bracket 18 and removable slider bracket 26. One embodiment of a cable management fixture is depicted in FIG. 3A.

As compared with the flush mount configuration of FIG. 1, when converting the rack rail system from a flush mount configuration to a center mount configuration, the removable slider brackets 26 are exchanged with one another and installed on the opposite rails (left to right or right to left). As part of the conversion process from flush mount to center mount (or vice versa), each removable slider bracket is rotated 180 degrees about the length of the posts and placed on the opposite rail. Comparing slider brackets of FIG. 1 and FIG. 3, the removable slider bracket 26 of the left rail 13 of the rack rail system of FIG. 1, which is shown in the flush mount configuration, is installed on the right rail 17 of the rack rail system of FIG. 3, which is shown in the center mount configuration. Likewise, the removable slider bracket 26 of the left rail 13 of FIG. 3 (center mount configuration) is installed on the right rail 17 of FIG. 1 (flush mount configuration). Thus, when converting the rail system from flush mount configuration to center mount configuration, or when converting the rack rail system from center mount configuration to flush mount configuration, the removable slider brackets 26 are exchanged with one another from rail to rail and rotated 180 degrees about the length of the posts. Depending on the configuration, the plate of the removable slider bracket is either mounted to the rear face (flush mount configuration) or front face (center mount configuration) of the posts of the rack. The presence of removable slider brackets allows a single rail system to be used for mounting a rail system in both the flush mount and center mount configurations.

The rack rail system disclosed herein combines in a single system a rack rail system for a two post rack that may be mounted in a flush mount or a center mount configuration. The rack rail system disclosed herein is stabilized on the posts of a two post rack because of the presence of the removable slider brackets, which serve to bracket a rail on each post of the rack, regardless of whether the rack rail system is in a center mount or flush mount configuration. In addition, because the rack rail system disclosed herein accommodates a sliding mechanism, the disclosed rack rail system provides for the serviceability of a computer system mounted in the rack rail system. Moreover, the use of a rear bracket with cable management fixtures permits cable management features in a rack rail system mounted on a two post rack.

The disclosed rack rail system is also able to accommodate computer systems and other housing of electronic units of varying heights. Traditional computer systems, especially server systems, are finding more application in a telecommunications and internet service provider environments. The disclosed rack rail system accommodates with structural stability and serviceability a computer system in the traditional two post rack of the telecommunications environment. For the sake of clarity, the present disclosure has been described with respect to rack rail systems that are designed with identifiable left and right rails. The present disclosure, however, is equally applicable to rack rail systems in which the first and second rails of the system are identical and thus not distinguishable as left and right rails.

The disclosed rack rail system is able to accommodate any housing for an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Although the present disclosure has been described in detail, it should be understood that various changes, substitutions, and alterations can be made hereto without departing from the spirit and the scope of the invention as defined by the appended claims.

What is claimed is:

1. A rail system for an equipment rack, comprising:
   first and second opposing rails, wherein each rail includes,
      a first bracket coupled to a first end of each rail;
      a second bracket coupled to each rail between the first bracket and a second end of each rail; and
      a removable third bracket that can be coupled to each rail between the first bracket and the second bracket;
   wherein the removable third brackets of the first and second rails can be positioned on the first rail and second rail thereby defining a first position; and
   wherein the removable third brackets can be exchanged with one another between the first rail and the second rail and positioned on the respective first and second rails following such exchange thereby defining a second position.

2. The rail system of claim 1, wherein the first rail and the second rail each includes a fourth bracket coupled to a second end of each rail.

3. The rail system of claim 2, wherein each fourth bracket includes a cable management fixture.

4. The rail system of claim 1, wherein the first position comprises the placement of the removable third brackets proximate the respective first brackets of the first rail and the second rail for coupling the first bracket and the removable third bracket of the first rail to a first post of the equipment rack and for coupling the first bracket and removable third bracket of the second rail to a second post of the equipment rack.

5. The rail system of claim 4, wherein the first brackets are approximately flush with the faces of the first post and second post of the equipment rack to which the first brackets are coupled.

6. The rail system of claim 1, wherein the second position comprises the placement of the removable third brackets proximate the respective second brackets of the first rail and the second rail for coupling the second bracket and the removable third bracket of the first rail to a first post of the equipment rack and for coupling the second bracket and removable third bracket of the second rail to a second post of the equipment rack.

7. The rail system of claim 6, wherein each removable third bracket is coupled to a rail at approximately the center of the rail.

8. The rail system of claim 1, wherein each removable third bracket includes a plate, oriented perpendicular to the length of the rail.

9. The rail system of claim 8, wherein the exchange of removable third brackets between the first rail and the second rail comprises the rotation of each removable third bracket such that the plate of each removable third bracket is oriented toward either the first bracket or the second bracket.

10. The rail system of claim 1, wherein each of the first and second opposing rails includes a slide mechanism attached along the length of the respective rails.

11. A method for converting a rail system for an equipment rack from a first position to a second position, wherein the first position includes the coupling of the rail system to posts of the equipment rack in a flush mount position, wherein the second position includes the coupling of the rail system to posts of the equipment rack in a center mount position, and wherein each rail is coupled to a post via a removable bracket, comprising the steps of:
   decoupling the removable bracket from each of a first and second rail of the rail system;
   coupling the removable bracket decoupled from the second rail to the first rail at a position such that when the bracket is further coupled to a first post, the first post will cross the first rail at approximately the middle of the length of the first rail; and
   coupling the removable bracket decoupled from the first rail to the second rail at a position such that when the bracket is further coupled to a second post, the second post will cross the second rail at approximately the middle of the length of the second rail.

12. The method of claim 11 for converting a rail system for an equipment rack from a first position to a second position,
   wherein each removable bracket includes a plate; and
   wherein the steps of coupling the removable brackets to the first rail and the second rail each comprises the steps of rotating the removable bracket such that the plate of the removable bracket is positioned toward a face of the respective first post and second post of the equipment rack.

13. The method of claim 12 for converting a rail system for an equipment rack from a first position to a second position, wherein each rail includes a fixed bracket coupling to the face of the post opposite the removable bracket.

14. A method for converting a rail system for an equipment rack from a first position to a second position, wherein the first position includes the coupling of the rail system to posts of the equipment rack in a center mount position, wherein the second position includes the coupling of the rail system to posts of the equipment rack in a flush mount position, and wherein each rail is coupled to a post via a removable bracket, comprising the steps of:
   decoupling a removable bracket from each of a first and second rails of the rail system;
   coupling the removable bracket decoupled from the second rail to the first rail at a position such that when the bracket is further coupled to a first post, the first post will cross the first rail at approximately an end of the length of the first rail; and
   coupling the removable bracket decoupled from the first rail to the second rail at a position such that when the bracket is further coupled to a second post, the second post will cross the second rail at approximately an end of the length of the second rail.

15. The method of claim 14 for converting a rail system for an equipment rack from a first position to a second position, wherein each removable bracket includes a plate; and wherein the steps of coupling the removable brackets to the first rail and the second rail each comprises the steps of rotating the removable bracket such that the plate of the removable bracket is positioned toward a face of the respective first post and second post of the equipment rack.

16. The method of claim 14 for converting a rail system for an equipment rack from a first position to a second position, wherein the each rail includes a fixed bracket coupling to the face of the post opposite the removable bracket.

17. A convertible rail system, comprising:

first and second rails, wherein each of the first and second rails includes:
- a first bracket attached to a first end of each rail;
- a second bracket attached to each rail between the first bracket and a second end of each rail; and
- a removable third bracket that can be attached to each rail between the first bracket and the second bracket wherein the removable third bracket of each of the first and second rails can be exchanged between the rails to accommodate the rails being positioned in first or second mounting configurations.

18. The convertible rails system of claim 17, wherein the first mounting configuration is a flush mount configuration in which the first bracket and the removable third bracket of each of the first and second rails are coupled to respective first and second posts.

19. The convertible rails system of claim 17, wherein the second mounting configuration is a center mount configuration in which the removable third bracket and the second bracket of each of the first and second rails are coupled to respective first and second posts.

20. The convertible rails system of claim 17, wherein each of the removable third brackets includes a plate that is perpendicular to the rails; and wherein each of the removable third brackets must be rotated 180 degrees when exchanged between the first and second rails.

* * * * *

UNITED STATES PATENT AND TRADEMARK OFFICE
CERTIFICATE OF CORRECTION

PATENT NO.   : 6,655,534 B2
DATED        : December 2, 2003
INVENTOR(S)  : Tiffany J. Williams and Clarence L. Langlinais, Jr.

It is certified that error appears in the above-identified patent and that said Letters Patent is hereby corrected as shown below:

<u>Title page,</u>
Item [75], Inventors, add: -- Robert J. Neville, Jr. --

Signed and Sealed this

Second Day of March, 2004

JON W. DUDAS
*Acting Director of the United States Patent and Trademark Office*